United States Patent
Morin et al.

(10) Patent No.: US 9,252,208 B1
(45) Date of Patent: Feb. 2, 2016

(54) UNIAXIALLY-STRAINED FD-SOI FINFET

(71) Applicants: STMicroelectronics, Inc., Coppell, TX (US); Commissariat à l'Énergie Atomique et aux Énergies Alternatives, Paris (FR); GLOBALFOUNDRIES Inc., Grand Cayman (KY)

(72) Inventors: Pierre Morin, Albany, NY (US); Maud Vinet, Rives (FR); Laurent Grenouillet, Albany, NY (US); Ajey Poovannummoottil Jacob, Watervliet, NY (US)

(73) Assignees: STMicroelectronics, Inc., Coppell, TX (US); Commissariat A L'Energie Atomique Et Aux Energies Alternives, Paris (FR); GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/447,678

(22) Filed: Jul. 31, 2014

(51) Int. Cl.
  *H01L 29/06* (2006.01)
  *H01L 29/66* (2006.01)
  *H01L 29/78* (2006.01)

(52) U.S. Cl.
  CPC ........ *H01L 29/0607* (2013.01); *H01L 29/0665* (2013.01); *H01L 29/66477* (2013.01); *H01L 29/78* (2013.01)

(58) Field of Classification Search
  CPC ................. H01L 29/66439; H01L 29/0673; H01L 29/1033; H01L 29/413; H01L 29/41775; H01L 29/66477; H01L 29/66795; H01L 29/7613; H01L 29/775; H01L 21/28518; H01L 27/11; H01L 27/1104; H01L 29/16
  See application file for complete search history.

(56) References Cited

U.S. PATENT DOCUMENTS

| | | | |
|---|---|---|---|
| 2012/0319178 A1* | 12/2012 | Chang et al. | 257/287 |
| 2014/0091360 A1* | 4/2014 | Pillarisetty et al. | 257/190 |
| 2014/0225065 A1* | 8/2014 | Rachmady et al. | 257/24 |
| 2015/0243784 A1 | 8/2015 | Morin | |

OTHER PUBLICATIONS

U.S. Appl. No. 14/253,904 titled, "Method to Co-integrate Oppositely Strained Semiconductor Devices on a Same Substrate" filed Apr. 16, 2014 (39 pages).

* cited by examiner

*Primary Examiner* — Roy Potter
*Assistant Examiner* — Paul Patton
(74) *Attorney, Agent, or Firm* — Seed IP Law Group PLLC

(57) ABSTRACT

Methods and structures for forming uniaxially-strained, nanoscale, semiconductor bars from a biaxially-strained semiconductor layer are described. A spatially-doubled mandrel process may be used to form a mask for patterning dense, narrow trenches through the biaxially-strained semiconductor layer. The resulting slicing of the biaxially-strained layer enhances carrier mobility and can increase device performance.

20 Claims, 14 Drawing Sheets

UNIAXIALLY-STRAINED FD-SOI FINFET

BACKGROUND

1. Technical Field

The technology relates to methods and structures for increasing current flow in strained semiconductor material.

2. Discussion of the Related Art

Transistors are fundamental device elements of modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors.

Two types of transistors have emerged within the MOSFET family of transistors that show promise for scaling to ultra-high density and nanometer-scale channel lengths. One of these transistor types is a so-called fin field-effect transistor or "finFET." The channel of a finFET is formed as a three-dimensional fin that may extend from a surface of a substrate. FinFETs have favorable electrostatic properties for complimentary MOS (CMOS) scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planar MOSFETs.

The second type of transistor is called a fully-depleted, silicon-on-insulator or "FD-SOI" FET. The channel, source, and drain of an FD-SOI FET is formed in a thin planar semiconductor layer that overlies a thin insulator. Because the semiconductor layer and the underlying insulator are thin, the bulk region of the transistor (that lies below the thin insulator and is sometimes referred to as a "back body" region) can act as a second backside gate for the thin body in the thin semiconductor layer. The thin layer of semiconductor on insulator permits higher body biasing voltages that can either boost performance or reduce leakage current depending on the desired operating mode. The thin insulator also reduces leakage current to a transistor's body region that would otherwise occur in bulk FET devices.

SUMMARY

The described technology relates to methods and structures for forming uniaxially-strained, nanoscale, semiconductor bars from a biaxially-strained layer of semiconductor. The methods and structures may be applied to the fabrication of FD-SOI transistors or any planar transistor in which the channel region is formed in a thin layer (e.g., a layer having a thickness less than approximately 30 nm) of strained semiconductor material. By converting a biaxially-strained layer to closely spaced, uniaxially-strained semiconductor bars, the current flow through the device may be increased by 30% or more. To form the closely spaced, uniaxially-strained, nanoscale, semiconductor bars, a spatially-doubled mandrel process may be used.

According to some embodiments, a strained-channel semiconductor-on-insulator transistor may comprise an insulating layer formed on a substrate, a plurality of nanoscale, strained semiconductor bars disposed on the insulator, and a gate formed over the plurality of nanoscale, strained semiconductor bars, wherein a spacing between the bars is less than 30 nm. A strained-channel semiconductor-on-insulator transistor may further comprise a channel region under the gate formed from a first portion of the plurality of nanoscale, strained semiconductor bars. In some implementations, a width of the semiconductor bars is greater than the spacing between the bars. In some aspects, the spacing between the bars is less than 10 nm.

According to some implementations, the plurality of nanoscale, strained semiconductor bars may have a uniaxial strain ratio at the channel regions greater than 10:1. In some implementations, the plurality of nanoscale, strained semiconductor bars may have a uniaxial strain ratio at the channel regions greater than 50:1. In some aspects, the channel regions may be fully depleted.

In some implementations, the insulating layer below the strained semiconductor bars is an ultra-thin buried oxide having a thickness less than 25 nm. In some aspects, the transistor is a FD-SOI transistor having an ultra-thin body, which is sliced into a plurality of uniaxially-strained semiconductor bars, and buried oxide layer.

According to some aspects, a width of each bar of the plurality of nanoscale, strained semiconductor bars is between approximately 10 nm and approximately 200 nm and a height of each bar is less than approximately 20 nm. In some aspects, the semiconductor bars are formed from silicon, whereas in other aspects, the semiconductor bars are formed from SiGe or SiC or any III-V material.

According to some implementations, a strained-channel semiconductor-on-insulator transistor may further comprise source and/or drain merging material formed at a source and/or drain region, wherein the source region comprises first portions of the plurality of nanoscale, strained semiconductor bars and the source merging material electrically connects the first portions. Similarly the drain region comprises second portions of the plurality of nanoscale, strained semiconductor bars and a drain merging material electrically connects the second portions. In some aspects, the source and/or drain merging material comprises an epitaxially-grown semiconductor material grown from the respective first and/or second portions of the plurality of nanoscale, strained semiconductor bars.

In some implementations, at least one strained-channel semiconductor-on-insulator transistor may be formed in a memory circuit. In some implementations, at least one strained-channel semiconductor-on-insulator transistor may be formed in a microprocessor circuit.

The foregoing aspects and implementations of a strained-channel semiconductor-on-insulator transistor may be present in any suitable combination in an embodiment of a strained-channel semiconductor-on-insulator transistor that comprises a plurality of sliced, uniaxially-strained, semiconductor bars. Additionally, any of the following method embodiments may be used to fabricate any of the transistor embodiments.

According to some embodiments, a method for making closely spaced, uniaxially-strained, nanoscale, semiconductor bars for FD-SOI transistors may comprise forming an array of mandrels adjacent a biaxial-strained semiconductor layer, wherein the strained semiconductor layer is disposed on an insulating layer formed on a substrate, and conformally coating the mandrels with a spacer layer. The method may further include acts of removing first portions of the spacer layer to expose upper surfaces of the mandrels, and leaving second portions of the spacer layer adjacent to sidewalls of the mandrels. In some embodiments, the method further includes covering the mandrels and second portions with a first hard resist material, removing some of the first hard resist material to expose upper surfaces of the second portions of the spacer layer, and removing the second portions of the spacer layer to form openings between the mandrels and remaining first hard resist material. According to some embodiments, the method further comprises etching the pattern of the openings to the strained semiconductor layer to expose strips of the strained semiconductor layer.

In some aspects, a method for making uniaxially-strained, nanoscale, semiconductor bars may comprise oxidizing the exposed strips to form uniaxially-strained, nanoscale, semiconductor bars. In some aspects, a method for making uniaxially-strained, nanoscale, semiconductor bars may comprise etching through the exposed strips to form nanoscale, semiconductor bars. According to some implementations, the exposed portions of the strained semiconductor layer have a width defined by a thickness of the spacer layer that is less than approximately 30 nm. In some implementations, the exposed portions of the strained semiconductor layer have a width defined by a thickness of the spacer layer that is less than approximately 10 nm.

According to some implementations, etching the exposed portions of the strained semiconductor layer converts biaxial strain in the semiconductor layer to predominantly uniaxial strain. In some aspects, a uniaxial strain ratio of semiconductor bars formed after etching the semiconductor layer is greater than 10:1. In some aspects, a uniaxial strain ratio of semiconductor bars formed after etching the semiconductor layer is greater than 50:1.

According to some implementations, a method for making uniaxially-strained, nanoscale, semiconductor bars may further comprise removing the mandrels and first hard resist material, and forming a gate structure over a plurality of the uniaxially-strained, nano scale, semiconductor bars. In some implementations, forming the gate structure comprises forming a gate insulator over at least a portion of the uniaxially-strained, nanoscale, semiconductor bars, and forming a gate conductor over the gate insulator.

In some aspects, a method for making uniaxially-strained, nanoscale, semiconductor bars may further comprise forming a merging semiconductor material at source and/or drain regions of the uniaxially-strained, nanoscale, semiconductor bars to electrically connect the uniaxially-strained, nanoscale, semiconductor bars at the source and/or drain regions. In some implementations, a method further comprises epitaxially growing a semiconductor material at source and/or drain regions of the uniaxially-strained, nanoscale, semiconductor bars to electrically connect the uniaxially-strained, nanoscale, semiconductor bars at the source and/or drain regions.

According to some implementations, a method for making uniaxially-strained, nanoscale, semiconductor bars may further comprise etching through a second hard mask located between the mandrels and strained semiconductor layer. In some aspects, a method may further comprise etching through exposed portions of the insulating layer after etching the exposed portions of the strained semiconductor layer. In some implementations, a method may further include filling regions between the uniaxially-strained, nanoscale, semiconductor bars with an insulator.

The foregoing aspects and implementations of acts to fabricate uniaxially-strained, nanoscale, semiconductor bars may be used in any suitable combination for an embodiment of a method for making uniaxially-strained, nanoscale, semiconductor bars and integrated electronic devices that incorporate such bars.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 1A:
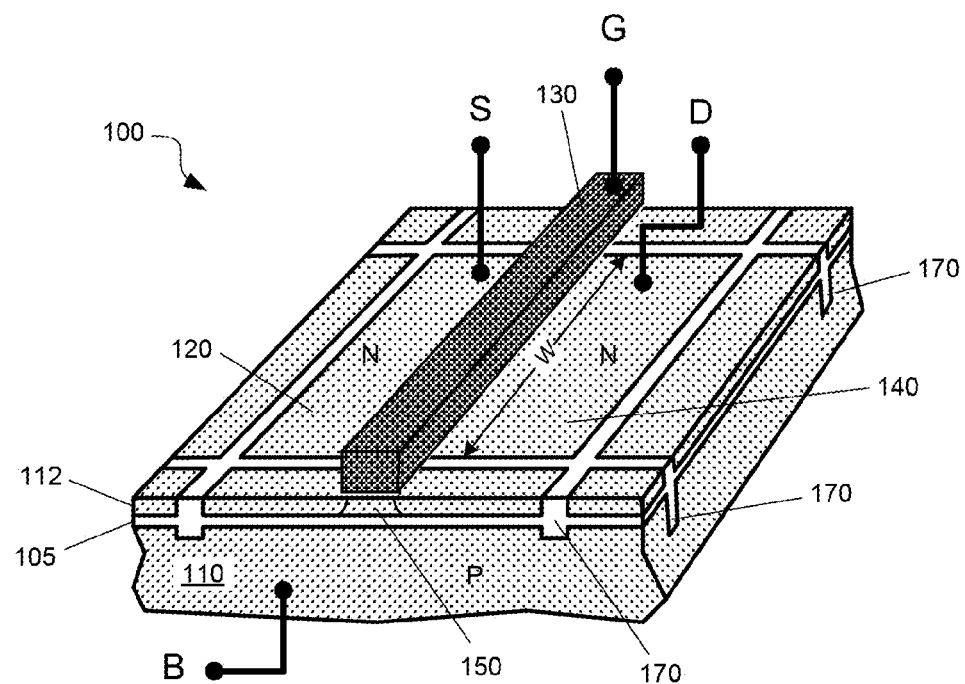
FIGS. 1A-1B depict a FD-SOI transistor and channel region, according to some embodiments.
Figure 1B:
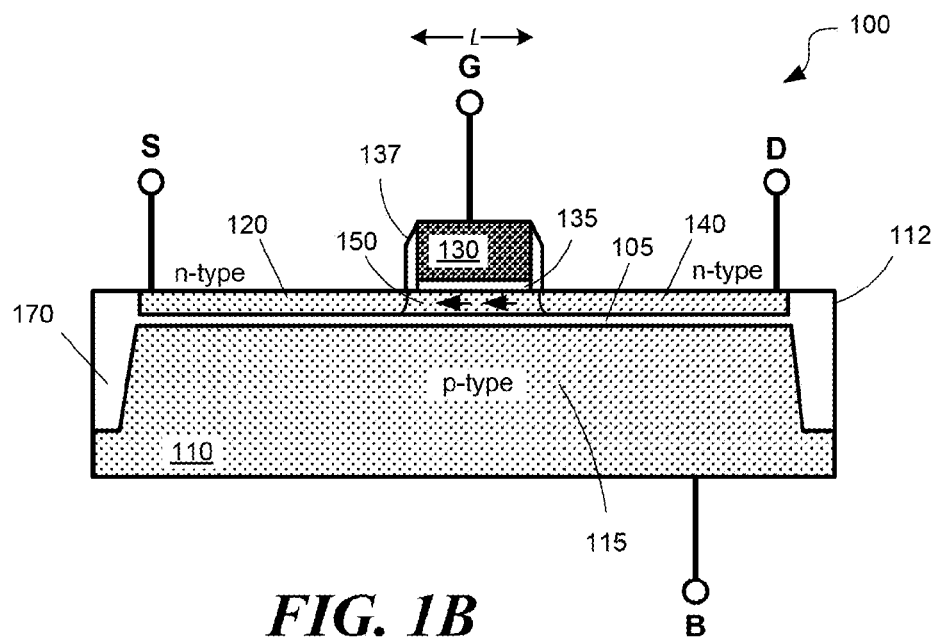

An example of a fully-depleted silicon-on-insulator (FD-SOI) FET 100 is depicted in FIGS. 1A-1B, according to some embodiments. The FD-SOI FET may comprise a source region 120, a gate structure 130, 135,137, a drain region 140, and a channel region 150. The source, channel region, and drain may be formed in a thin semiconductor layer 112 that is formed adjacent a thin insulating layer 105 or buried oxide layer 105. The thin insulating layer may be formed adjacent a substrate 110. In some embodiments, trench isolation structures 170 comprising electrically-insulating material may be formed around one or more FD-SOI FETs. The gate structure may comprise a gate conductor 130, spacers 137, and a thin gate insulator 135. According to some embodiments, integrated source S, gate G, drain D, and body B interconnects may be formed to provide electrical connections to the source, gate, drain, and back body regions of the FD-SOI FET.

In some embodiments, the source region 120 and drain region 140 of a FD-SOI FET may be doped with donor or acceptor impurities to form regions of a first conductivity type (e.g., n-type or p-type). According to some implementations, the channel region 150 may comprise a single, continuous region of the semiconductor layer 112 and have a width W as depicted in the drawings. The channel region 150 may be doped to be of an opposite conductivity type than that of the source and drain regions. In some implementations, the channel region 150 may be undoped. In some embodiments, the channel region may be of a same conductivity type as a back body region 115.

Figure 2A:
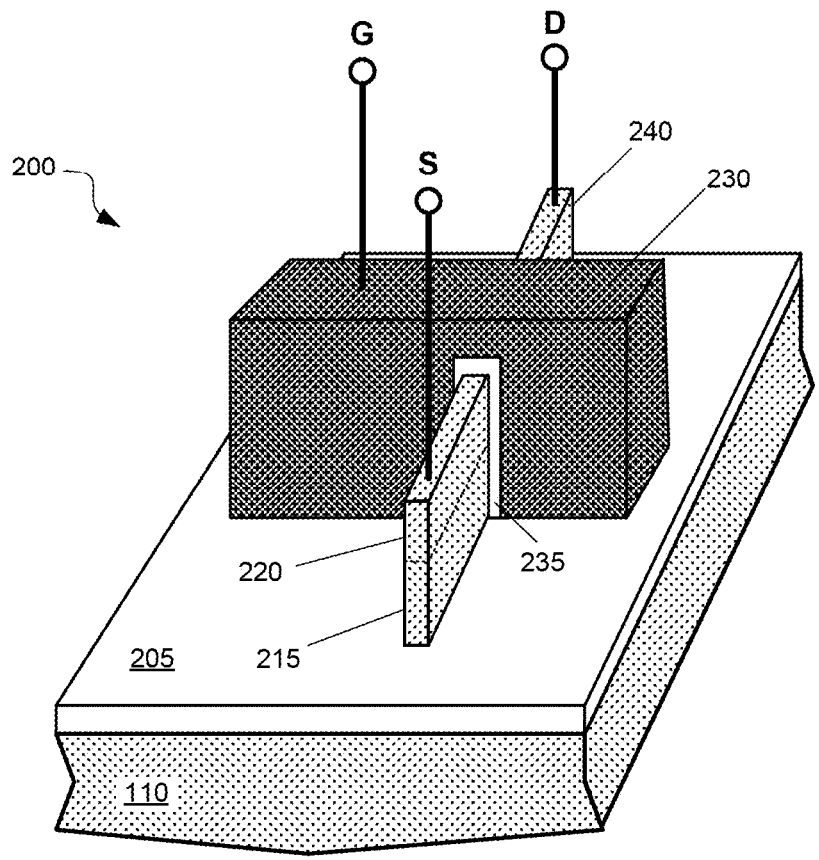
FIGS. 2A-2B depict a finFET and channel region, according to various embodiments.
Figure 2B:
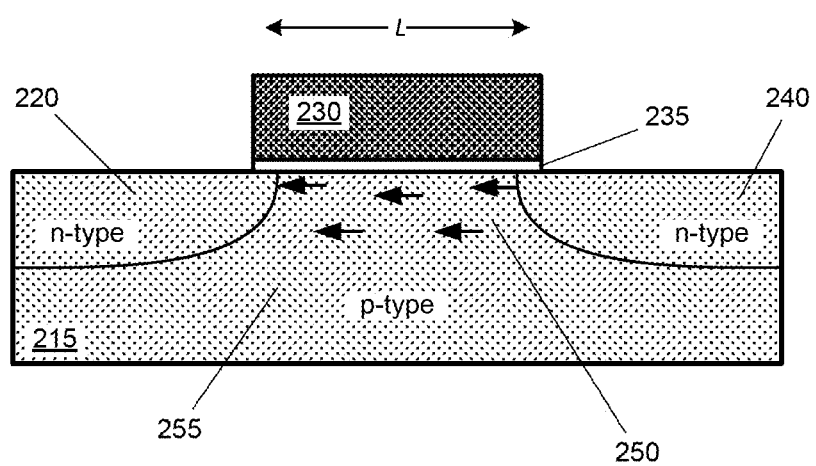

An example of a finFET 200 is depicted in illustrations of FIGS. 2A-2B. A finFET may be fabricated on a bulk semiconductor substrate 110, e.g., a silicon substrate, and comprise a fin-like structure 215 that runs in a length direction along a surface of the substrate and extends in a height direction normal to the substrate surface. The fin 215 may have a narrow width, e.g., less than 50 nanometers. There may be an electrically-insulating layer 205, e.g., an oxide layer having a thickness up to 750 nm, on a surface of the substrate 110. In some implementations, the insulating layer 205 may be thin, e.g., less than 100 nm, and the fin may pass through the insulating layer 205, but be attached to the semiconducting substrate 110 at a lower region of the fin. A gate structure comprising a conductive gate material 230 (e.g., polysilicon) and a gate insulator 235 (e.g., an oxide) may be formed over a region of the fin. A channel region 250 may be surrounded by the gate on three sides, and there may be a body region 255 near the base of the fin and/or centrally within the fin. The finFET may further include a source region 220 and drain region 240 adjacent to the gate. A finFET may also include integrated source S, gate G, drain D, and body B (not shown) interconnects to provide electrical connections to the source, gate, drain, and back body regions of the device.

As explained above, FD-SOI FETs and finFETs can exhibit favorable electrical characteristics when scaled to smaller sizes. FD-SOI FETs can have some attractive features that are not realizable with finFETs. For example, independent back-body biasing is possible with FD-SOI devices to control dynamically device threshold voltages. Also, FD-SOI can use conventional processing techniques for planar transistors, whereas finFETs require more specialized fabrication techniques for forming out-of-plane source, channel, and drain regions. In some cases, it may be easier to strain channel regions in FD-SOI devices than in finFETs.

Figure 3A:
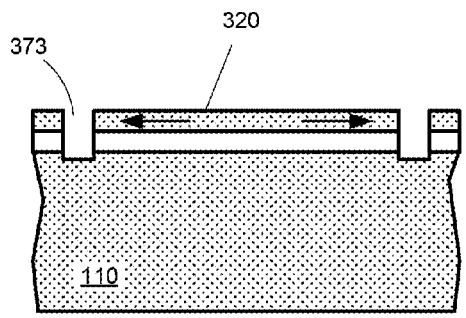
FIGS. 3A-3C depict strained semiconductor-on-insulator structures, according to some embodiments.
Figure 3B:
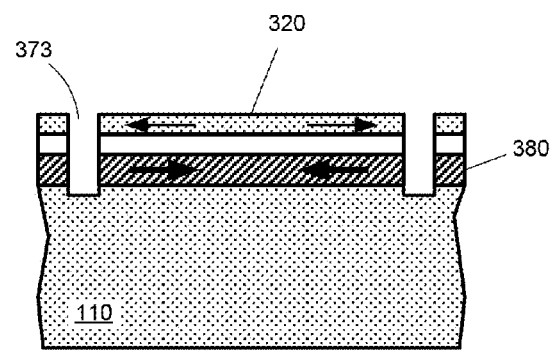
Figure 3C:
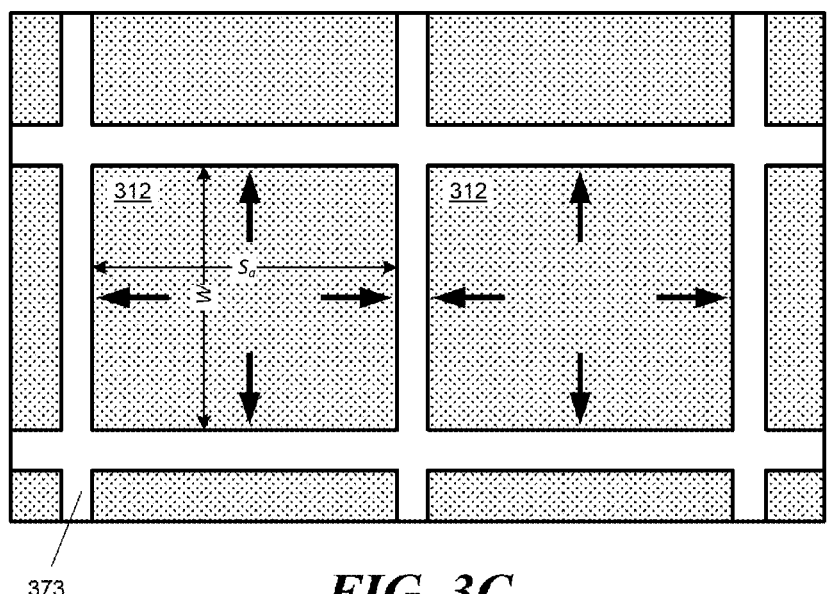

The inventors have appreciated that several techniques may be used to form biaxially-strained semiconductor-on-insulator layers 320, as depicted in FIGS. 3A-3C. According to some embodiments, a strained semiconductor-on-insulator (SSOI) layer may be formed using acts of ion implantation, amorphization, and recrystallization, as described in U.S. patent application Ser. No. 14/253,904 titled, "Method to Co-integrate Oppositely Strained Semiconductor Devices on a Same Substrate" and filed Apr. 16, 2014, which is incorporated herein by reference in its entirety. In some embodiments, an SSOI layer may be formed using acts for forming a strain-inducing layer 380 on a substrate, forming a semiconductor layer adjacent the strain-inducing layer, and forming stress-relief isolation trenches 373 through the semiconductor layer 320 and at least partially through the strain-inducing layer 380, as described in U.S. patent application Ser. No. 14/186,342 titled, "Method to Form Strained Channel in Thin BOX SOI Structures by Elastic Strain Relaxation of the Substrate" and filed Feb. 21, 2014, which is incorporated herein by reference in its entirety. Other techniques for forming a biaxially-strained, semiconductor-on-insulator layer may be used in other embodiments.

In some implementations, biaxially-strained, semiconductor-on-insulator regions 312 may be formed between isolation trenches 373, as depicted in FIG. 3C using any suitable technique. The strained regions 312 may each be used to fabricate a FD-SOI transistor, having a channel width W and an active length $S_a$. For example, an FD-SOI transistor as depicted in FIGS. 1A-1B may be formed at each region 312. Because of the strain present in the semiconductor layer 320, carrier mobility can be improved compared to a device having no strain in the semiconductor layer.

Figure 4:
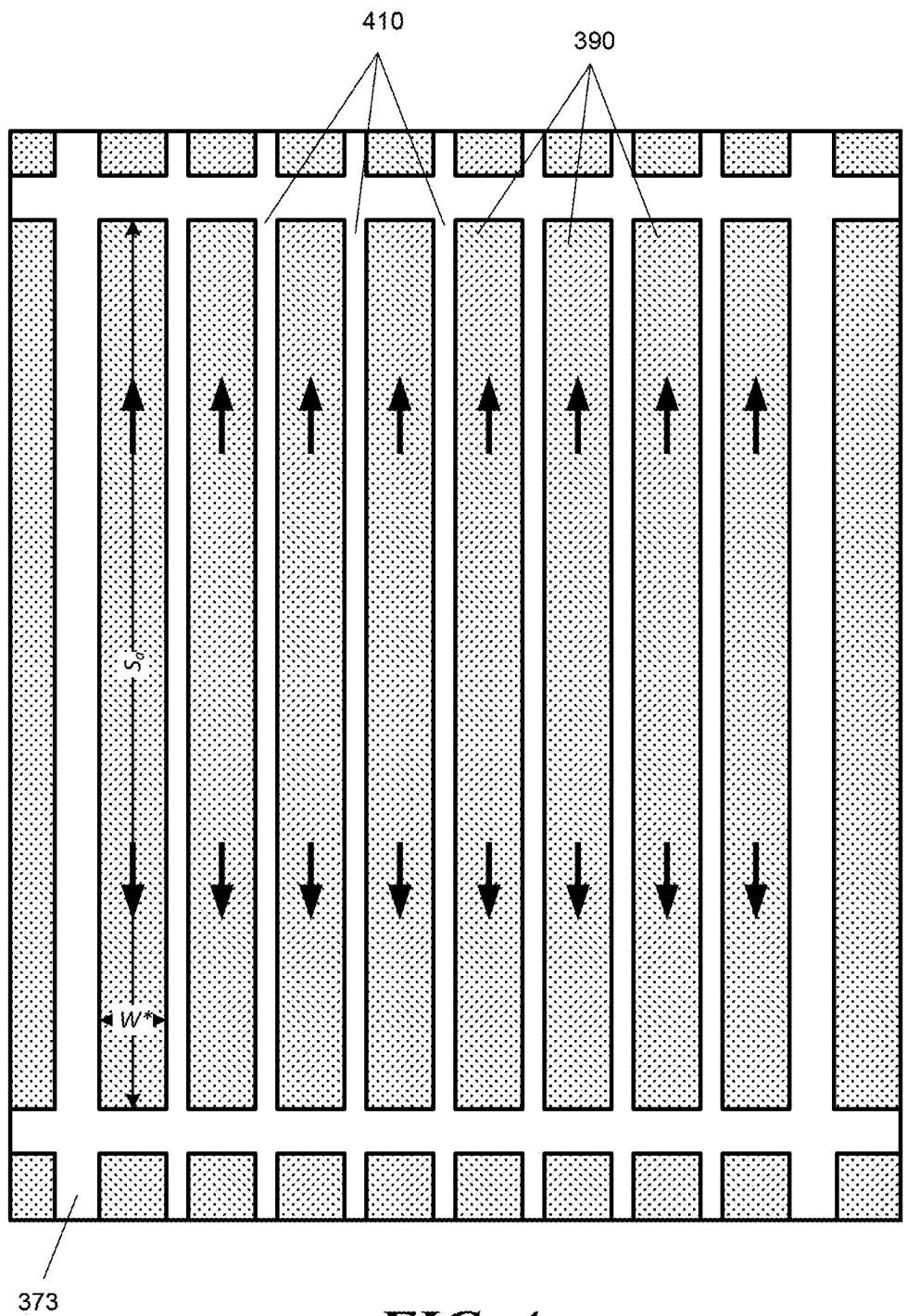
FIG. 4 depicts a plan view of uniaxially-strained, nanoscale semiconductor bars, according to some embodiments.

The inventors have conceived of techniques and structures for converting a biaxially-strained semiconductor-on-insulator layer 320 into a plurality of nanoscale, uniaxially-strained semiconductor bars 390, as depicted in FIG. 4. The inventors have appreciated that, in some cases, the conversion to uniaxial strain can yield higher carrier mobility than biaxial strain in the channel region. The inventors have found that in some cases, further improvements in device performance can be achieved by effectively slicing a biaxially-strained region 312 of width W into a plurality semiconductor bars 390 having widths W* that are appreciably smaller than the initial channel width W of the device. The inventors have found that the slicing (and resulting carrier mobility enhancement) can increase the amount of current switched by the device, even though the cutting removes some semiconductor material from the channel region that would otherwise be available to carry current in the device. Device performance can be improved through enhanced mobility attributed to conversion of biaxial strain to uniaxial strain in the semiconductor.

Figure 5A:
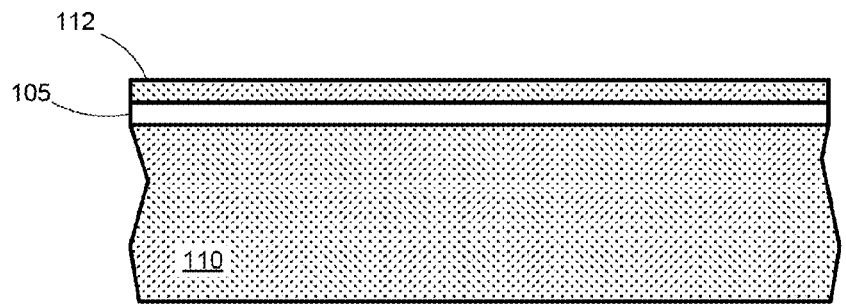
FIGS. 5A-5J depict structures associated with methods for forming uniaxially-strained, nanoscale semiconductor bars, according to some implementations.

FIGS. 5A-5J depict structures associated with methods for forming uniaxially-strained, nanoscale semiconductor bars 390 from biaxially-strained regions 312, according to some embodiments. Referring to FIG. 5A, a process for forming uniaxially-strained, nanoscale semiconductor bars may begin with obtaining or forming a biaxially-strained semiconductor layer 112 on an insulator layer 105 on a substrate 110. The substrate 110 may be any suitable semiconducting substrate, or in some embodiments a ceramic or glass substrate. For example, substrate 110 may comprise bulk silicon, and may be in the form of a chip, die, or wafer. Substrate 110 may be formed from other semiconducting materials in some implementations including, but not limited to, group IV semiconductors and III-V semiconductors. For example, substrate 110 may be formed of any of the following materials in some embodiments: Ge, SiGe, SiC, GaAs, InP, InGaAs, GaN, and AlGaAs.

In some embodiments, insulating layer 105 comprises an oxide, e.g., a silicon oxide, though in some implementations any other suitable insulator may be used. The insulating layer 105 may have a thickness between approximately 5 nm and approximately 30 nm, according to some embodiments. In some implementations, the insulating layer may have a thickness between approximately 5 nm and approximately 15 nm. In some implementations, the insulating layer 105 may be an insulating layer of an ultra-thin body and buried oxide (UTBB) substrate. In other embodiments, insulating layer 105 may comprise a nitride layer, or a high-K dielectric layer.

The terms "approximately," "substantially," and "about" may be used herein to mean within ±20% of a target value in some embodiments, within ±10% of a target value in some embodiments, within ±5% of a target value in some embodiments, and yet within ±2% of a target value in some embodiments. The terms "approximately," "substantially," and "about" may include the target value.

The biaxially-strained semiconductor layer 112 may be any suitable semiconductor material. According to some embodiments, strained semiconductor layer comprises silicon (Si), or a compound semiconductor such as silicon germanium (SiGe) or silicon carbide (SiC). Other materials that may be used for strained semiconductor layer 112 include, but are not limited to: Ge, GaAs, InP, InGaAs, GaN, and AlGaAs. In some embodiments, the thickness of the strained semiconductor layer 112 is between approximately 3 nm and approximately 20 nm. In some implementations, the thickness of the strained semiconductor layer is between approximately 5 nm and approximately 9 nm.

Figure 5B:
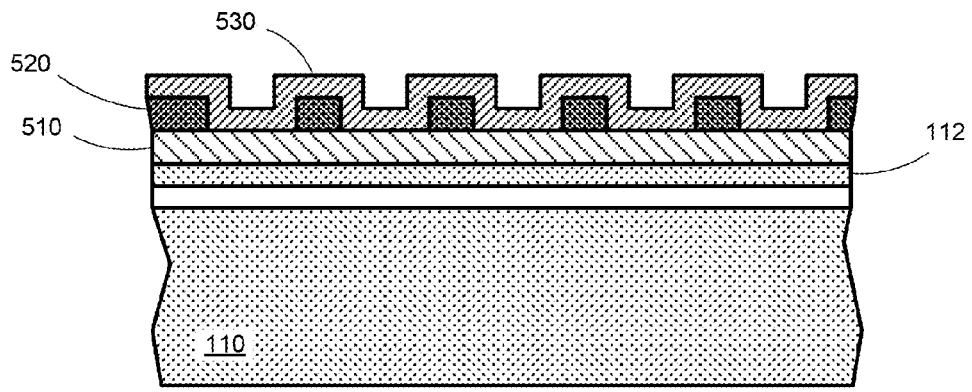

According to some embodiments, a first hard mask layer 510 may be formed over the strained semiconducting layer 112, as depicted in FIG. 5B. A second hard mask layer may be formed over the first hard mask layer 510, and patterned to form mandrels 520. The first and second hard mask layers may be formed by any suitable process, e.g., a vapor deposition process or physical deposition process. In some embodiments, a plasma-enhanced chemical-vapor deposition (PECVD) process or atomic layer deposition (ALD) process may be used to form the first and second hard mask layers.

The mandrels 520 may be formed by any suitable photolithography process. In some embodiments, the mandrels may be patterned as a grating structure having a periodicity of between approximately 80 nm and approximately 1000 nm. In some implementations, the periodicity may be larger, for example, any value between 1 μm and 10 mm. The mandrels 520 may be patterned by depositing and exposing a photoresist over the second hard mask layer, developing the photoresist, and etching through the second hard mask layer in regions where the photoresist has been removed to expose the second hard mask layer. The photoresist may be subsequently stripped from the wafer leaving the mandrels 520. In some embodiments, EUV lithography may be used in a process to pattern mandrels 520. In some implementations, nanoimprint lithography may be used in a process to pattern the mandrels.

The first hard mask layer 510 and the mandrels 520 may be formed from any suitable material or materials. In various embodiments, the first hard mask layer 510 exhibits etch selectivity over the strained semiconductor layer 112. For example, the first hard mask layer 510 may be etched with a dry or wet etching process that does not appreciably etch the strained semiconductor layer 112. As a non-limiting example, if the strained semiconductor layer 112 is formed from silicon, the first hard mask layer may be formed from silicon nitride ($SiN_x$) or an oxide (e.g., $SiO_x$).

According to some embodiments, the second hard mask layer (in which the mandrels 520 will be formed) exhibits etch selectivity over the first hard mask layer. Continuing with the above example, the second hard mask layer may be formed from silicon, whereas the first hard mask layer may be formed of an oxide or a nitride. Other material combinations may be used in other embodiments.

The thickness of the first hard mask layer may be between approximately 10 nm and approximately 60 nm, and the thickness of the second hard mask layer may be between approximately 20 nm and approximately 100 nm. In various embodiments, the thickness of an upper masking layer will be sufficiently thick so as to be able to etch through an underlying layer without completely removing the upper layer. For example, the first hard mask layer 510 may be thick enough such that during an etch through the underlying strained semiconductor layer 112, at least some of the first hard mask layer 510 will remain to cover portions of the semiconductor layer 112 that are not intended to be etched. If there is high etch selectivity between successive layers, an upper layer may not be thicker than a lower layer.

In various embodiments, a conformal layer 530 may be formed over the mandrels 520, as depicted in FIG. 5B. The conformal layer 530 may exhibit etch selectivity over the mandrels 520 and the first hard mask layer 510. For example, according to some embodiments, the conformal layer 530 may be formed of a nitride (e.g., $SiN_x$), the mandrels 520 may be formed of silicon (e.g., polysilicon), and the first hard mask layer 510 may be formed of an oxide (e.g., $SiO_x$). With such a combination of materials, a wet or dry etch process (e.g., a dry etch comprising $CH_3F$) may be used to etch the conformal layer 530 without appreciably etching the mandrels 520 or first hard mask layer 510. Other material combinations may be used in other embodiments. The thickness of the conformal layer may be between approximately 3 nm and approximately 60 nm, in some implementations. According to some embodiments, the thickness of the conformal layer 530 is between 3 nm and approximately 15 nm. The conformal layer may be deposited by any suitable process, including a plasma deposition process or an atomic layer deposition process.

Figure 5C:
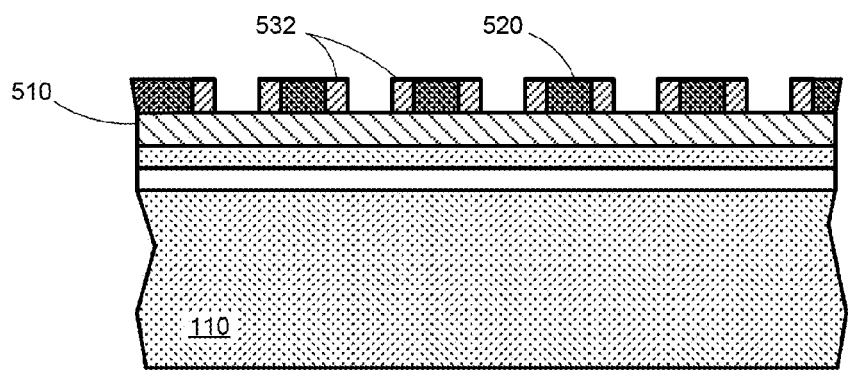

According to some implementations, the conformal layer 530 may be etched back, as depicted in FIG. 5C. The etch-back may comprise a dry anisotropic etch (e.g., a reactive ion etch), in some embodiments. The anisotropic etch may be timed, so that an amount of material approximately equivalent to the thickness of the conformal layer 530 is removed. As a result, sidewall spacers 532 will remain at sidewall portions of the mandrels 520 after the anisotropic etch, as depicted in FIG. 5C. The lateral widths of the sidewall spacers 532 will be approximately equivalent to the thickness of the conformal layer 530 as deposited.

Figure 5D:
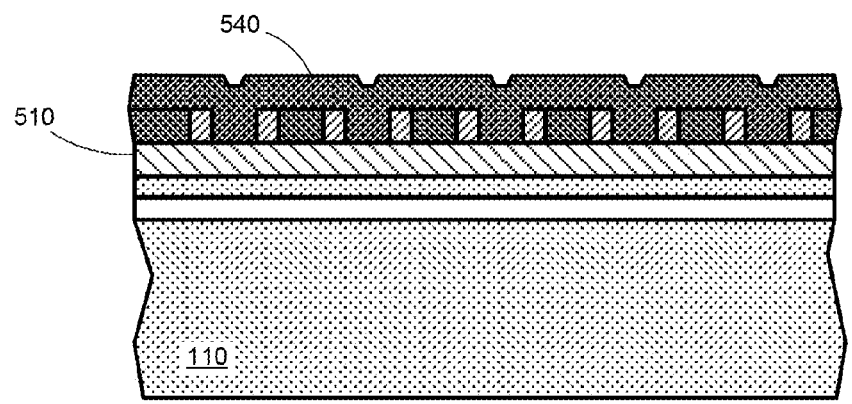

In a subsequent step, as depicted in FIG. 5D, a filler hard mask 540 may be formed over the substrate. The filler hard mask may be deposited by any suitable vapor or physical deposition process. According to some embodiments, the filler hard mask 540 may be formed of the same material as the mandrels 520, though in other embodiments a different material may be used. The thickness of the filler hard mask 540 may be equivalent to, or greater than, the thickness of the mandrels, according to some embodiments. As illustrated, the filler hard mask may fill the regions between the mandrels as well as cover the mandrels and the sidewall spacers 532.

Figure 5E:
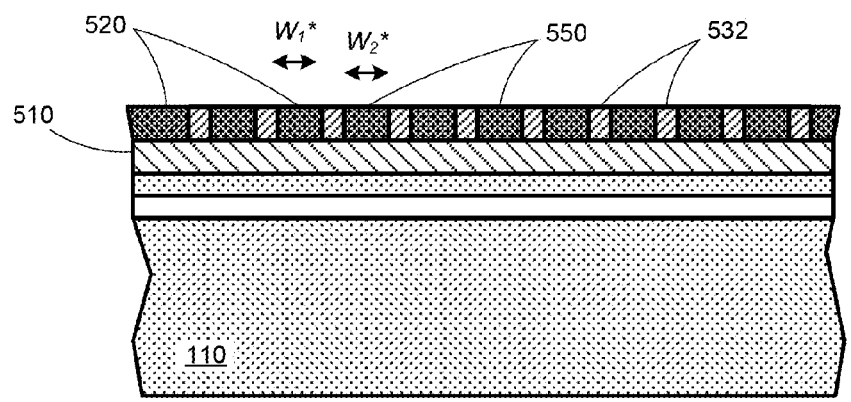

In some implementations, at least a portion of the filler hard mask 540 may be etched or removed, leaving a structure depicted in FIG. 5E. For example, a chemical mechanical polishing (CMP) process may be used to etch back the filler hard mask to the top of the sidewall spacers 532. The chemical mechanical polishing step may be selective to the filler hard mask material, and not appreciably etch the sidewall spacer material 532. Accordingly, the CMP step may effectively stop on the sidewall spacer material. After the etch-back of the filler hard mask material 540, fillers 550 remain between sidewall spacers 532 and between mandrels 520. According to some embodiments, the mandrels have a first lateral width $W_1^*$, and the fillers 550 have a second lateral width $W_2^*$. Although the two widths $W_1^*$ and $W_2^*$ are shown as being substantially equal in FIG. 5E, in some embodiments, the widths may be different.

It may be appreciated from the depictions in FIGS. 5A-5E that a spatial periodicity of the mandrels is effectively reduced by a factor of two using the spacer layer 530 and filler layer 540. As will be seen in the following illustrations, the process substantially reduces the gaps between the original mandrels (see FIG. 5B) to a smaller dimension substantially defined by the thickness of the spacer layer 530 (see FIG. 5F). In some embodiments, the process described in FIGS. 5A-5E may be repeated. For example the sidewall spacers 532 or the mandrels 520 and fillers 550 may be removed from the structure shown in FIG. 5E, and a second, thinner conformal layer (not shown) may be formed over the mandrels 520 and fillers 550. The steps depicted in FIGS. 5C-5E may then be repeated.

According to some embodiments, the sidewall spacers 532 may be removed by a wet etch or a dry etch. In some implementations, a reactive ion etch (RIE) may be used to remove sidewall spacers. In some implementations, a wet isotropic etch (e.g., a hot phosphoric etch comprising $H_3PO_4$ acid) may be used to remove the sidewall spacers. In some embodiments, a dry anisotropic etch may be used to remove sidewall spacers 532, and a same or different etch recipe may be used to remove exposed portions of the underlying first hard mask layer 510. The etch may continue to the top of the strained semiconductor layer 112, in some embodiments, resulting in the structure depicted in FIG. 5F. The etching to the top of the strained semiconductor layer 112 may expose strips along the top surface of the layer 112.

Figure 5F:
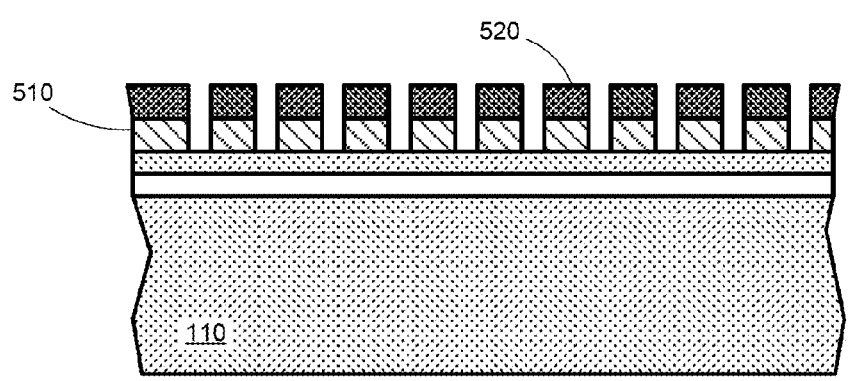
Figure 5G:
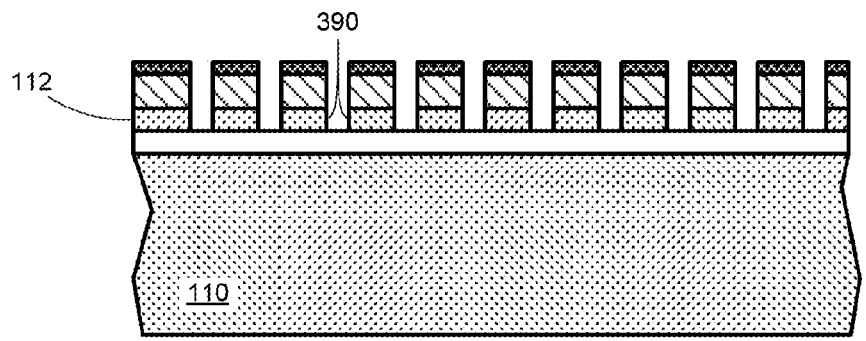

In some implementations, a dry anisotropic etch may be used to etch through the biaxially-strained semiconducting layer 112, as depicted in FIG. 5G. Etching through the biaxially-strained semiconductor layer 112 effectively cuts or slices the strained semiconductor layer to yield the nanoscale semiconductor bars 390. Because of the cutting, strain that is transverse to the length of the bars is relieved, and the remaining strain in the semiconductor bars 390 can be substantially uniaxial. The resulting type of strain can be compressive or tensile along the lengths of the bars. In various embodiments, the type of strain (compressive or tensile) will be unchanged from the initial. The directionality of the strain (biaxial or uniaxial) can change appreciably because of the cutting. Transformation from biaxial strain to uniaxial strain can improve carrier mobility within the bars 390, according to some embodiments.

Figure 5H:
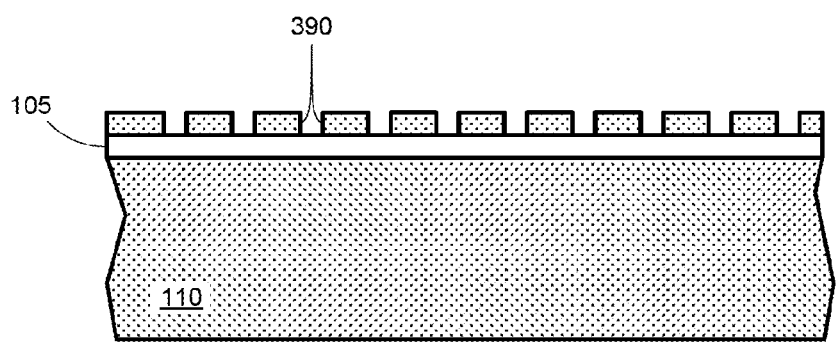
Figure 5I:
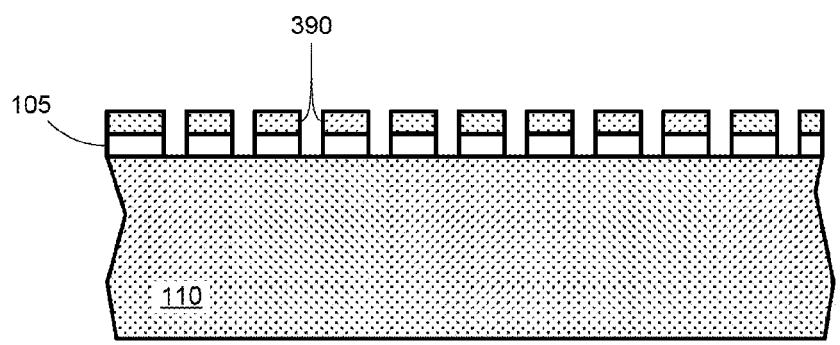

Any remaining material from the mandrels 520, fillers 550, and/or first hard mask layer 510 may be removed from the substrate using a dry etch and/or a wet etch process or combination of processes, according to some embodiments. The resulting structure after removal of the mandrels, fillers, and first hard mask layer may be that depicted in FIG. 5H, according to some embodiments. In some implementations, the underlying oxide 105 may be etched through before removing at least the first hard mask layer. In some embodiments, the first hard mask layer 510 may be formed of an oxide, so that some or all of this layer is removed in a subsequent etch through the underlying oxide 105. The resulting structure may then be that shown in FIG. 5I. Etching through the underlying oxide layer 105 can further relieve transverse strain in the semiconductor bars 390, according to some embodiments. In some embodiments, the underlying oxide 105 may not be etched, so that the structure remains as shown in FIG. 5H.

Figure 5J:
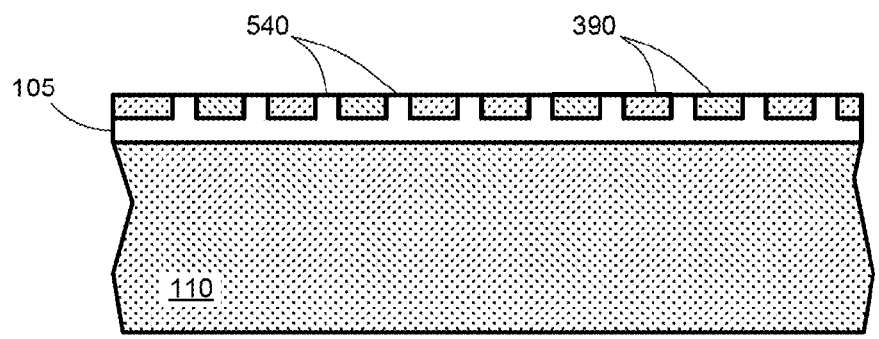

In some implementations, the regions between the semiconductor bars 390 may be filled with an oxide, as depicted in FIG. 5J. These regions may be filled by depositing any suitable oxide with a suitable deposition process. For example, a silicon oxide may be deposited using a plasma deposition process, or an atomic layer deposition process. In some embodiments, a shallow trench isolation process may be used to fill the regions between the semiconductor bars 390. In some implementations, the regions may be filled using an ethylene glycol (EG) oxide deposition process. After the regions are filled, the oxide may be etched back to expose the top surfaces of the uniaxially-strained semiconductor bars 390, e.g., using a CMP step. In other embodiments, the regions between the semiconductor bars 390 may not be filled, leaving a structure like that shown in FIG. 5H.

As an alternative process to producing a structure like that shown in FIG. 5J, in some implementations, etching of the mandrel and filler pattern through the first hard mask layer 510 may be terminated at the biaxially-strained semiconducting layer 112, as depicted in FIG. 5F. With at least the patterned first hard mask layer 510 remaining on the strained semiconducting layer 112, the exposed portions of the strained semiconducting layer 112 may be oxidized. For example, the exposed portions may be subjected to a thermal oxidation process to convert the exposed portions into silicon dioxide. The conversion of those portions to an oxide may provide the structure as shown in FIG. 5J. Subsequently, any remaining material from the mandrels, fillers, and/or first hard mask layer may be removed from the substrate.

In some embodiments, the conversion of portions of the biaxially-strained semiconducting layer 112 to an oxide may also relieve transverse strain in the formed semiconductor bars. For example, if the biaxially-strained layer 112 is under tensile stress, formation of the thermal oxide can form compressive stress locally. The compressive stress may cancel the transverse tensile stress, in some embodiments. In some implementations, the conversion of portions of the biaxially-strained semiconducting layer 112 to an oxide may increase stress along the length of the formed semiconductor bars 390. For example, compressive stress resulting from thermal oxidation in the regions between the bars may add more compressive stress along the length of the bars than transverse to the bars. In some embodiments, the elastic modulus of the formed oxide may be appreciably lower than that of the semiconductor bars, and allow for relaxation of the transverse stress in the bars without significantly altering the longitudinal stress in the bars 390.

In various embodiments, a gate structure may be formed over the uniaxially-strained, nanoscale bars 390 that are depicted in either FIG. 5H or FIG. 5J. For example, and referring to FIG. 5K, a gate insulator 565 and gate conductor 570 may be formed over the semiconductor bars 390 that have been formed according to the process described in connection with FIG. 5H. The gate insulator 565 may be formed by a thermal oxidation process, or it may be formed by a vapor deposition process (e.g., atomic layer deposition). In some implementations, the gate insulator may be formed over a region of the substrate in which semiconductor bars 390 are located, or over a larger area. Subsequently, a gate conductor 570 may be patterned over the gate insulator. In some embodiments, a gate conducting material (e.g., polysilicon or a metal silicide) may be deposited substantially uniformly over the region of the substrate. Photolithography (or any suitable lithographic process) may be used to pattern a resist over the gate conducting material. The gate conducting material may then be etched, using the photoresist as an etch mask, to remove portions of the gate conducting material that will not be used to form gate conductors 570. In some embodiments, a dry anisotropic etch may be used to etch the gate conducting material. A subsequent etch may be carried out to remove exposed regions of gate insulating material that is not under the remaining gate conductor 570, according to some embodiments.

Figure 5K:
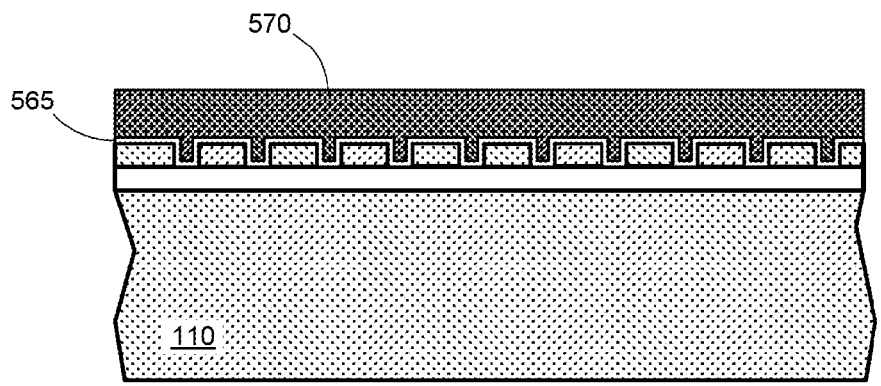
FIGS. 5K-5M depict structures associated with methods for forming semiconductor-on-insulating transistors from the uniaxially-strained, nanoscale, semiconductor bars, according to some implementations.
Figure 5L:
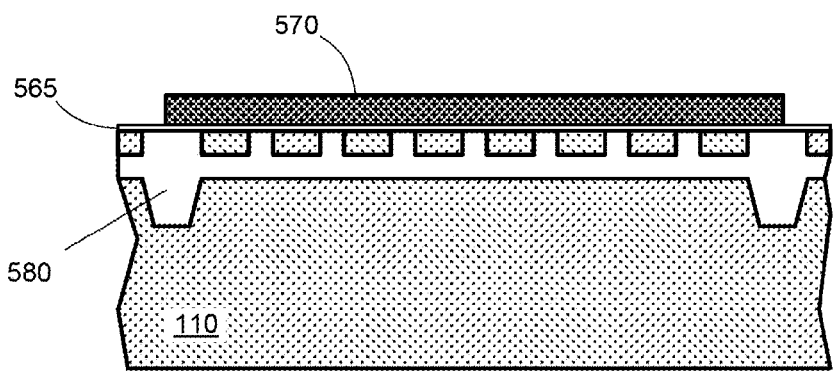

According to some embodiments, a FD-SOI transistor may be formed from a plurality of uniaxially-strained, nanoscale bars 390, as depicted in FIG. 5L. FIG. 5L illustrates an embodiment in which a gate insulator 565 is formed over a structure shown in FIG. 5J. In some embodiments, trench isolation structures 580 may be formed around each transistor. The trench isolation structures 580 may comprise an oxide or any other suitable insulator deposited in an etched trench. The trench isolation structures may be patterned before the slicing of the strained semiconducting layer 112 or after the slicing of the strained semiconducting layer.

Figure 5M:
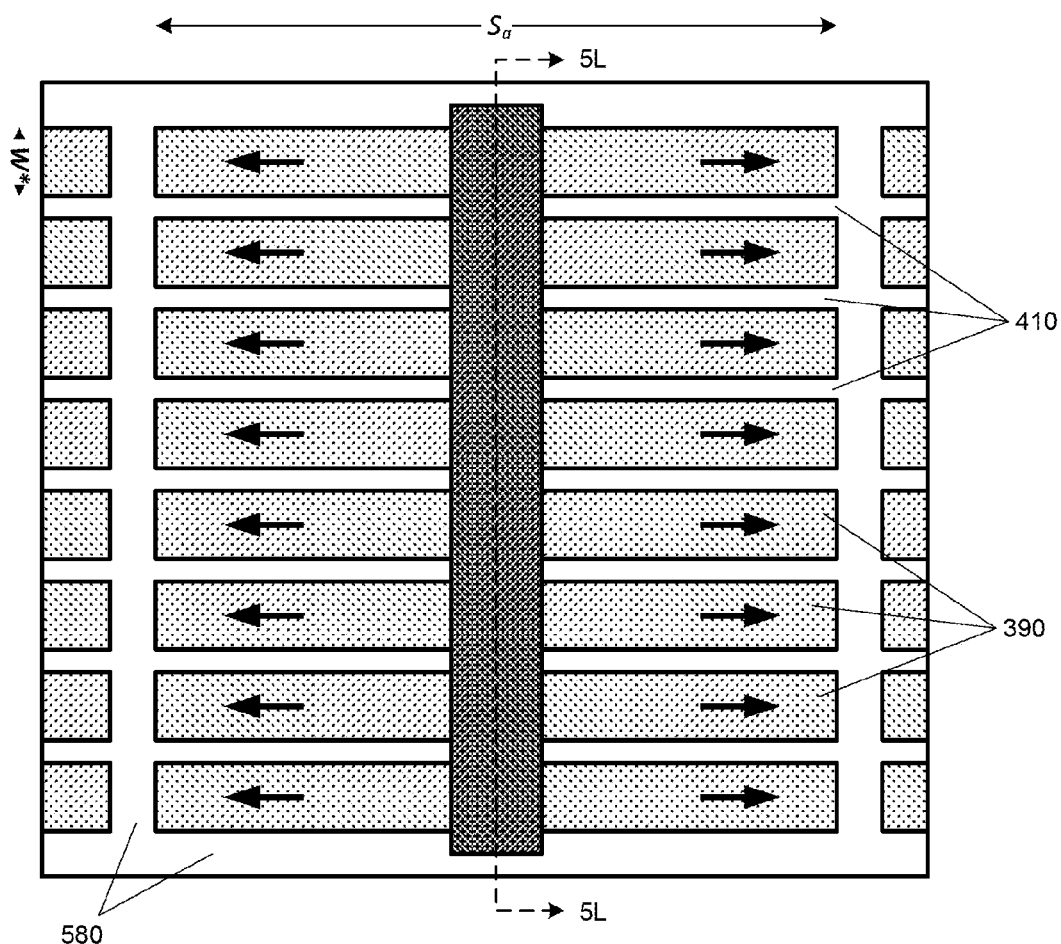

A plan view of one transistor comprising uniaxially-strained semiconductor bars 390 is illustrated in FIG. 5M, according to some embodiments. Because of the slicing of the biaxially-strained semiconductor layer, the resulting bars 390 have substantially uniaxial strain. The device may have a length of its active area denoted $S_a$, and the width of each bar may be W*. In some embodiments, alternating bars may have different widths. There may be a plurality of nanoscale spaces 410 between each bar. The spaces 410 may be filled with insulating material, in some embodiments. A width of the spaces may be between approximately 3 nm and 40 nm according to some embodiments, and between approximately 3 nm and 15 nm according to some implementations.

Figure 6A:
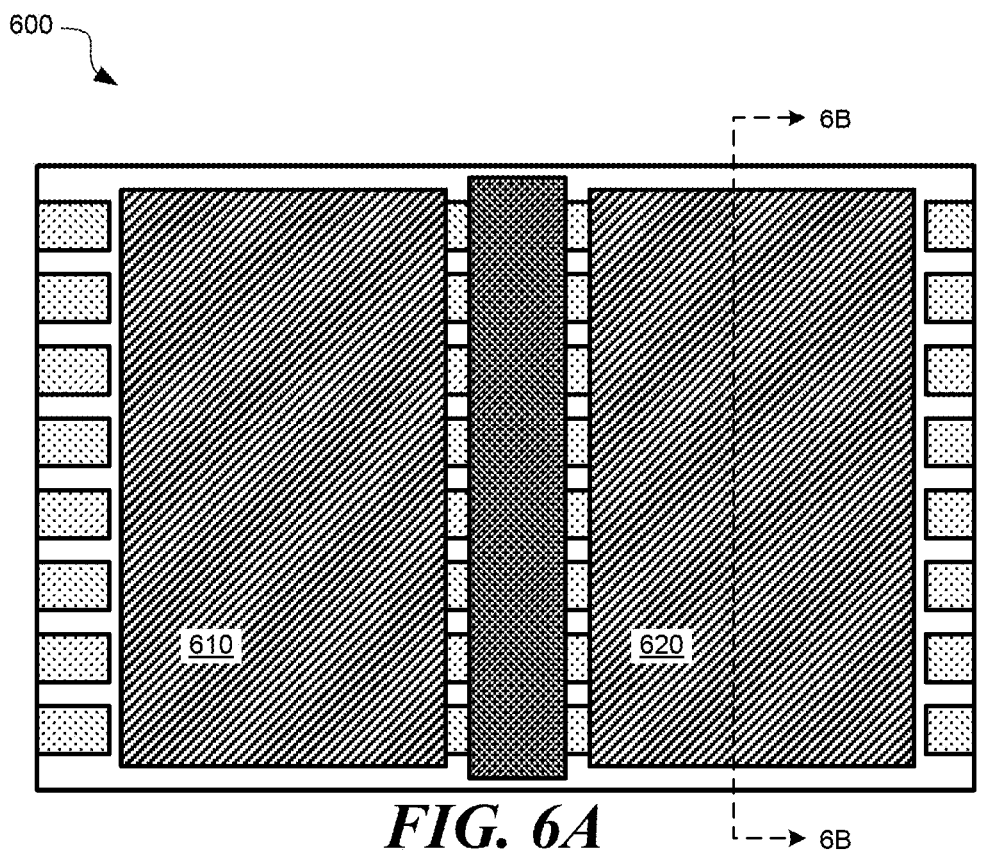
FIGS. 6A-6B illustrate merged source and drain regions of a transistor, according to some embodiments.
Figure 6B:
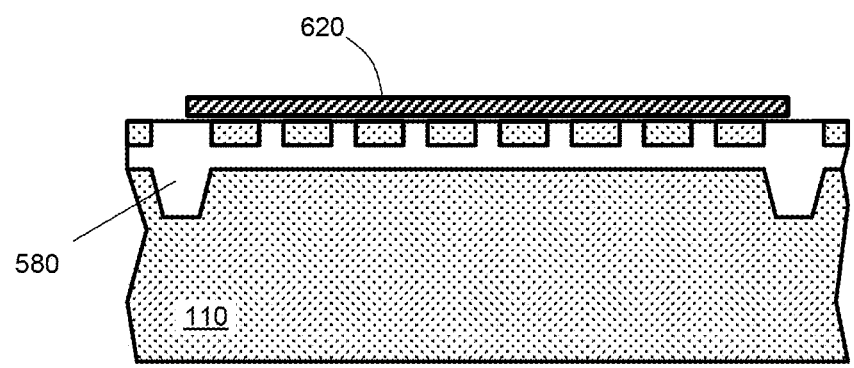

In some implementations, source and drain regions of the transistor 600 may be merged, as depicted in FIGS. 6A-6B. For example, a merging semiconducting material 620 may be epitaxially grown or otherwise formed over the semiconductor bars 390 in each of the source and drain regions. The merging semiconductor 620 may grow from the bars and cross the substrate merging with epitaxially grown semiconducting material from adjacent bars. In some cases, the bars may be merged using any suitable vapor or physical deposition process. A physical deposition process may include, but not be limited to, sputtering or electron-beam evaporation. In some embodiments, the merging material may be a conductor (e.g., a metal or metal alloy) instead of a semiconductor. In various embodiments, the merging material 620 provides a larger and more convenient region of contact for the source and drain regions of the transistor 600, as may be appreciated by comparing FIG. 5M with FIGS. 6A-6B.

According to some embodiments, the merging semiconducting material 620 may be selected to further strain the channel regions of the device. For example, the merging semiconducting material 620 may have a lattice constant that is mismatched from the underlying semiconductor bars 390.

In various embodiments, an FD-SOI transistor with a sliced active area may comprise multiple nanoscale channels formed of semiconductor bars 390. In some cases, as depicted in FIG. 5K, the multiple channels may have a three-dimensional structure underneath the gate conductor 570. In such an embodiment, the semiconductor bars may form inverted channels on top and side surfaces of the semiconductor bars 390, similar to finFET devices. Increased surface area for channel inversion can increase an amount of current that the device can carry, in addition to improvements in current due to enhancements in carrier mobility by conversion to uniaxial strain.

Because the semiconducting bars 390 are substantially uniaxially strained, the plurality of channel regions below the gate conductor (see FIG. 1A, channel region 150) will also be uniaxially strained. Accordingly, enhancements in mobility are also realized in the channel regions. In some implementations, the uniaxially-strained channel region may be partially or fully depleted.

In some embodiments, the width or widths of the semiconductor bars 390 may be between approximately 10 nm and approximately 1000 nm. In some embodiments, the width or widths of the semiconductor bars may be between approximately 10 nm and approximately 200 nm, and yet in some implementations, the width or widths of the semiconductor bars may be between approximately 10 nm and approximately 100 nm. In some embodiments, the spaces 410 between the semiconductor bars 390 may be between approximately 3 nm and approximately 50 nm. The spaces between the semiconductor bars may be between approximately 3 nm and approximately 30 nm according to some embodiments, and yet between approximately 3 nm and approximately 10 nm according to some embodiments. In some embodiments, the widths of the semiconducting bars 390 is greater than the spaces 410 between the bars.

Figure 7A:
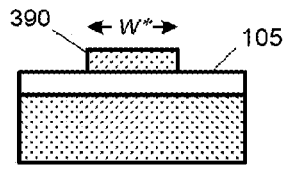
FIGS. 7A-7D illustrate a dependence of transverse channel strain on device design variations, according to some embodiments.
Figure 7B:
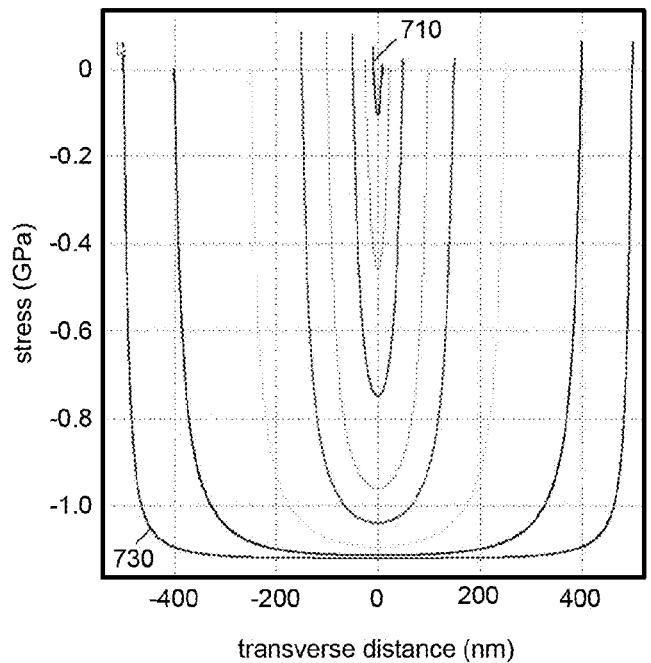
Figure 7C:
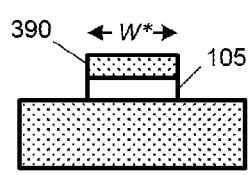

FIGS. 7A-7D depict structures and results from associated numerical simulations of stress in SiGe semiconductor bars 390, according to some embodiments. FIG. 7A depicts a model of the semiconducting bar having a width W*. The semiconducting bar sits on top of an oxide layer 105 that has an approximately uniform thickness across the underlying substrate. FIG. 7C also depicts a model of a semiconducting bar of width W*. However, in the case of FIG. 7C, the underlying oxide layer has been etched to remove portions that are not covered by the bar 390, as illustrated. The structure shown in FIG. 7A was selected for modeling purposes to resemble the structure of FIG. 5H, and the structure shown in FIG. 7C was selected to resemble the structure shown in FIG. 5I.

FIG. 7B shows several traces of calculated stress in the semiconducting bar 390 as a function of the width W* of the bar. For the simulation, the bar is cut (etched) from a uniform, biaxially-strained layer of semiconducting material. For purposes of the model, the length of the bar is much greater than the width, so that end effects of the bar can be ignored. The thickness of the semiconducting layer was taken to be approximately 7 nm. The lower trace 730 in the graph represents values of transverse stress (in the direction of the bar's width) calculated across the bar when the bar has a width W* of approximately 1 μm. The upper trace 710 represents values of transverse stress within the bar when the bar width is approximately 40 nm. As may be appreciated from the traces, a substantial amount of the transverse stress can be relieved by cutting the bar to narrow widths. In the example, approximately $\frac{1}{10}^{th}$ of the transverse stress remains in a bar cut to a width of 40 nm, as compared to a bar cut to a width of approximately 1 μm.

Figure 7D:
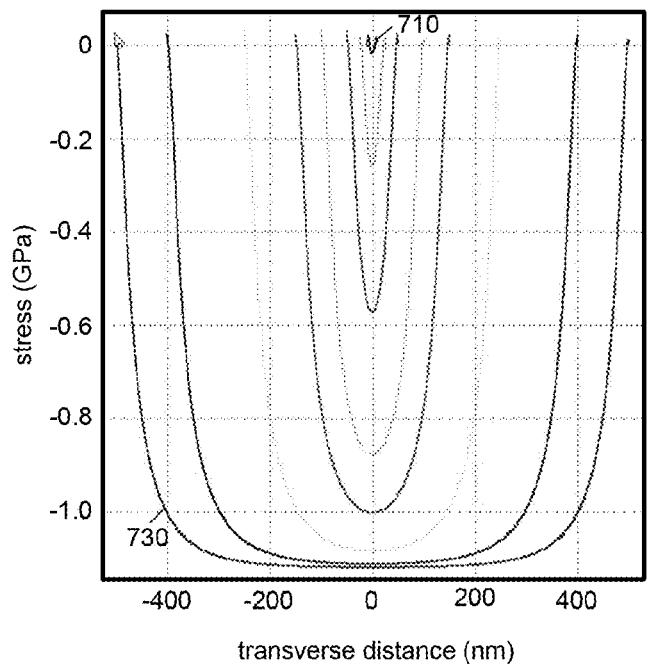

Stress relief is more pronounced for the case shown in FIG. 7C. FIG. 7D illustrates the corresponding values of transverse stress for an embodiment in which the underlying oxide 105 is also etched. In FIG. 7D, the lower curve 730 represents the case where the width of the semiconductor bar 390 is 1 μm, and the top curve 710 represents a case where the width of the semiconductor bar is 40 nm. For the intermediate traces, the widths of the semiconductor bar was 800 nm, 500 nm, 300 nm, 200 nm, 100 nm, and 80 nm. As can be seen in FIG. 7D, nearly all of the transverse stress is relieved in the semiconductor bar cut to a width of 20 nm. In the case of FIGS. 7C-7D, additional transverse stress relief is obtained by etching the underlying oxide layer. For the simulations corresponding to FIG. 7A-7D, a thickness of the semiconductor bar 390 was taken to be approximately 6 nm, and a thickness of the underlying oxide 105 was taken to be approximately 25 nm.

A uniaxial stress ratio may be estimated from the graphs of FIG. 7B and FIG. 7D, in some embodiments. For example, the biaxial stress for both cases can be observed to be approximately −1.15 gigaPascals (GPa), as observed at the center of the bar for the widest bars (lower traces 730). By cutting the bar to a width W* of 20 nm for the embodiment depicted in FIG. 7A, the transverse stress reduces to approximately −0.1

GPa, whereas the stress along the length of the bar remains substantially the same (not shown in the graph). Accordingly, for the embodiment shown in FIG. 7A, the uniaxial stress ratio becomes at least 10:1 when the width of the semiconductor bar is reduced to about 20 nm.

For the case shown in FIG. 7C, the uniaxial stress ratio becomes greater than 50:1 when the bar with is reduced to 20 nm. This added increase in stress ration can be attributed to additional stress relief provided by cutting the underlying oxide 105. In some embodiments, the uniaxial stress ratio for the case shown in FIG. 7C may be greater than 100:1. Other values of uniaxial stress ratio may be obtained for other widths of the semiconductor bar 390.

Figure 8:
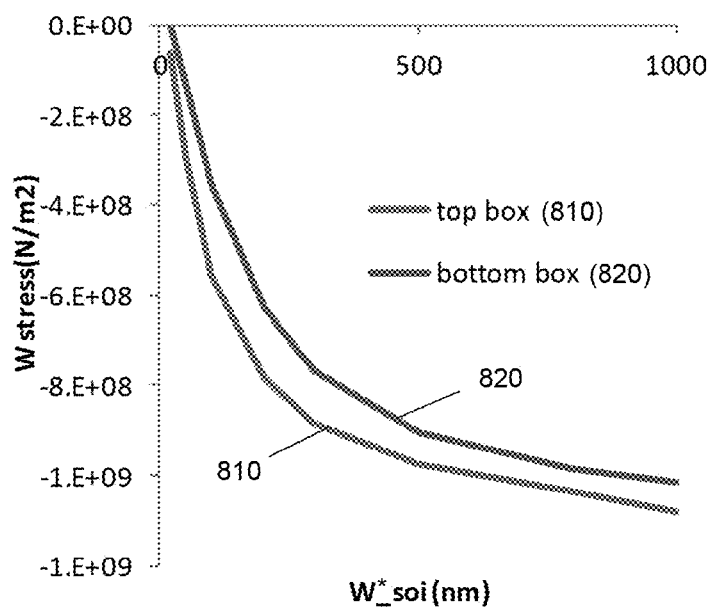
FIG. 8 illustrates a dependence of transverse channel strain on device design variations, according to some embodiments.

FIG. 8 is a graph of transverse-directed stress in a semiconductor bar 390 as a function of the width of the semiconductor bar that has been cut from a biaxially-strained layer of material, according to some embodiments. The lower curve 810 in FIG. 8 corresponds to the case where the etch through the semiconductor bar stops at the top of the buried oxide layer 105 (as depicted in FIG. 7A). The upper curve 820 corresponds to the case where the etch through the semiconductor bar continues additionally through the buried oxide layer (as depicted in FIG. 7B). The two curves in FIG. 8 correspond to the values of transverse stress calculated at the center of the semiconductor bars in the graphs of FIGS. 7B and 7D. As can be seen in FIG. 8, etching through the buried oxide layer can further reduce the transverse stress in the semiconductor bar. Additionally, the traces also show that the rate of change in a reduction of transverse stress increases significantly below a semiconductor bar width of approximately 300 nm.

Figure 9:
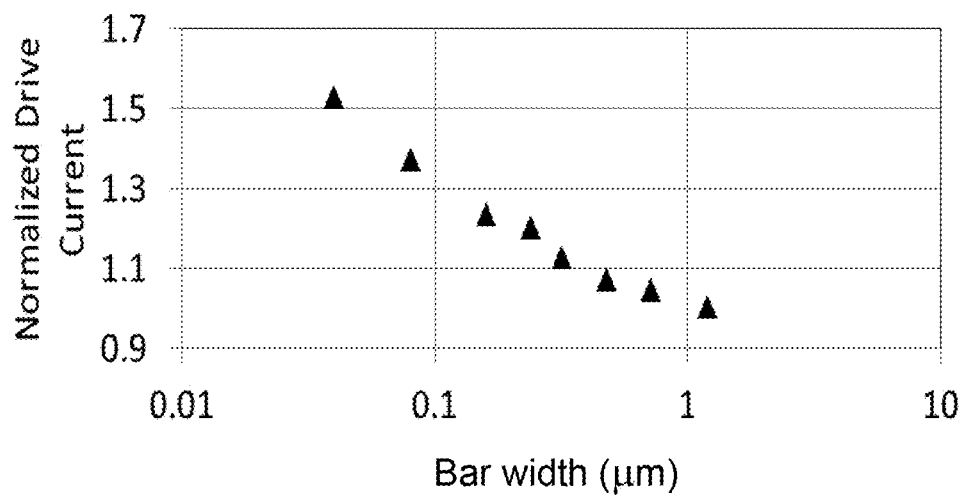
FIG. 9 illustrates experimentally-measured increases in current density with decreasing widths of a single channel that is initially strained biaxially.

FIG. 9 represents experimental results of normalized drive current as a function of width W* for a semiconductor bar that is cut from a biaxially-strained layer of SiGe material. The drive current is computed as a current per transverse dimensional unit of the semiconductor bar (e.g., amps/micron) at a fixed bias voltage, and has been normalized to a value obtained for the widest bar width of approximately 1.2 µm. The thickness of the SiGe layer was approximately 6 nm. The graph shows that as a width of the semiconductor bar is reduced from approximately 1.2 µm to approximately 20 nm, the normalized current through the bar increases. This increase in current is attributed to an increase in carrier mobility as a result of converting biaxial stress in the bar to uniaxial stress. As can be seen from the graph of FIG. 9, in some embodiments, an increase in current of more than a 50% may be obtained by slicing the semiconductor layer to convert biaxial stress to uniaxial stress within the bar.

Figure 10A:
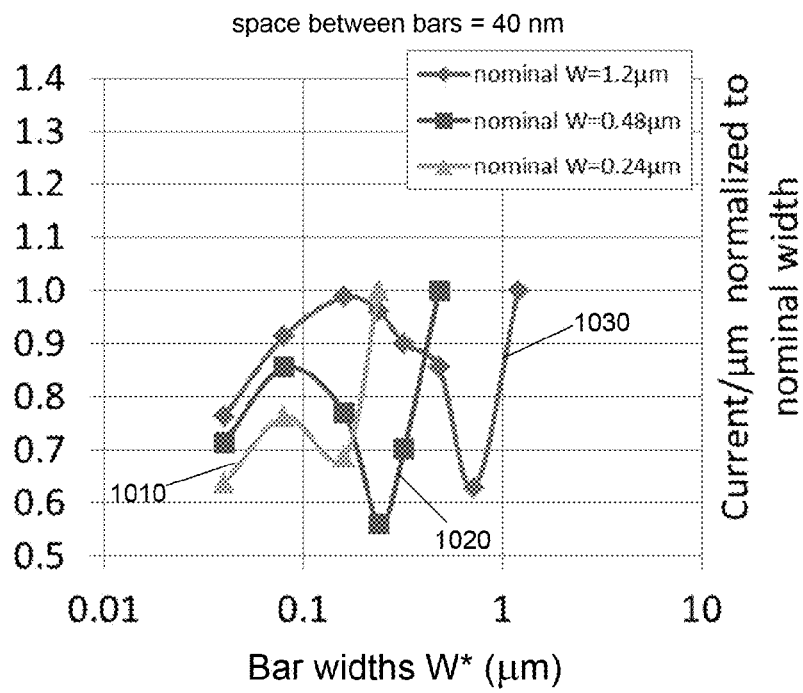
FIGS. 10A and 10B represent numerical simulations of current gain for two approaches to forming uniaxially-strained, nanoscale semiconductor bars for different initial transistor dimensions.
Figure 10B:
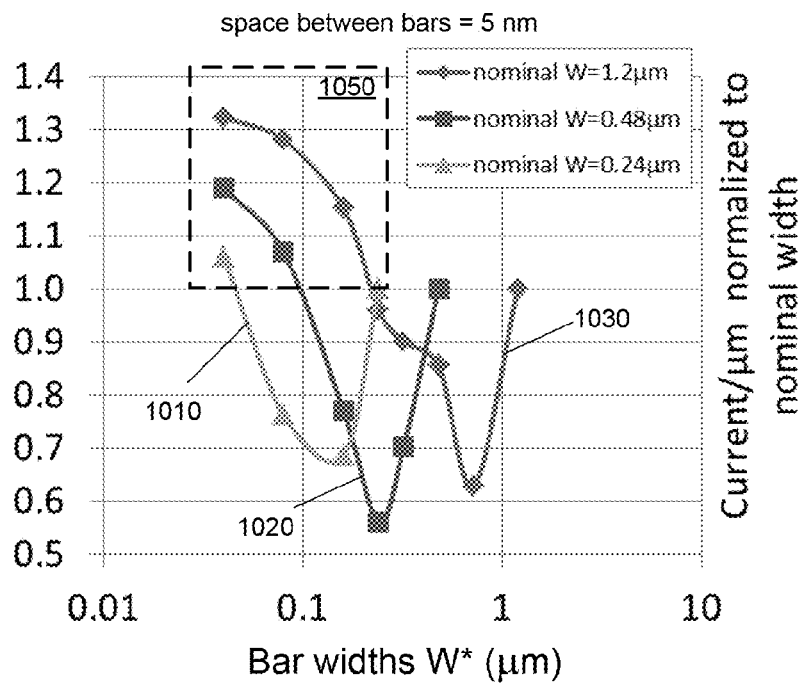

Changes in current through FD-SOI transistors having sliced channel regions under various slicing conditions are depicted in FIGS. 10A-10B, according to some embodiments. Each graph represents three cases, in which the active regions in each of three transistors having different nominal width values are sliced into 1 to N parts to create nanoscale semiconductor bars 390. For each simulation, 1 to N slices are trialed down to a smallest width of about 20 nm. For example, in FIG. 10A, a first transistor has a nominal channel width of 1.2 µm represented by curve 1030, a second transistor has a nominal channel width of 0.48 µm represented by curve 1020, and a third transistor has a nominal channel width of 0.24 µm represented by curve 1010. For each of the three cases in FIG. 10A, a spacing between the nanoscale semiconductor bars 390 is 40 nm. For each of the cases in FIG. 10B, a spacing between the nanoscale semiconductor bars 390 is 5 nm. For both FIG. 10A and FIG. 10B, values of current are computed per a nominal transverse width of the channel, and then normalized to the current value found for the unsliced active area.

For both the cases of FIG. 10A and FIG. 10B, initial slicing of the transistors' channels results in a net reduction of current through the device as the larger active area is replaced by a single slice having a narrower width for which the transverse strain is not appreciably relieved, as indicated in FIG. 8. For the case depicted in FIG. 10A, as the slicing of the channel goes to finer dimensions (less than approximately one-half the initial or nominal bar width wherein more than one slice may be used to replace the larger active area), current begins to increase. Although the current increases, it does not return to a value of the original uncut channel for the case shown in FIG. 10A. At smaller channel widths, each device in FIG. 10A exhibits a reduction in channel current. The reduction and channel current at fine dimensions can be attributed to the larger space, approximately 40 nm, between the semiconductor bars 390 for the embodiments shown in FIG. 10A.

For the embodiments represented by FIG. 10B (where the spacing between bars is 5 nm), a net current gain can be achieved. As in FIG. 10A, initial slicing of the transistors' channels results in a net reduction of current through the device (due to a low number of slices and presence of appreciable transverse strain). However, for the embodiments of FIG. 10B, finer slicing of the transistors' channels results in a net increase in current that can exceed the nominal current through the uncut channel of each device. The enhanced current is indicated by the dashed box 1050. In some cases, the current can be more than 30% greater than the nominal current through the biaxially-strained, uncut channel.

Figure 11A:
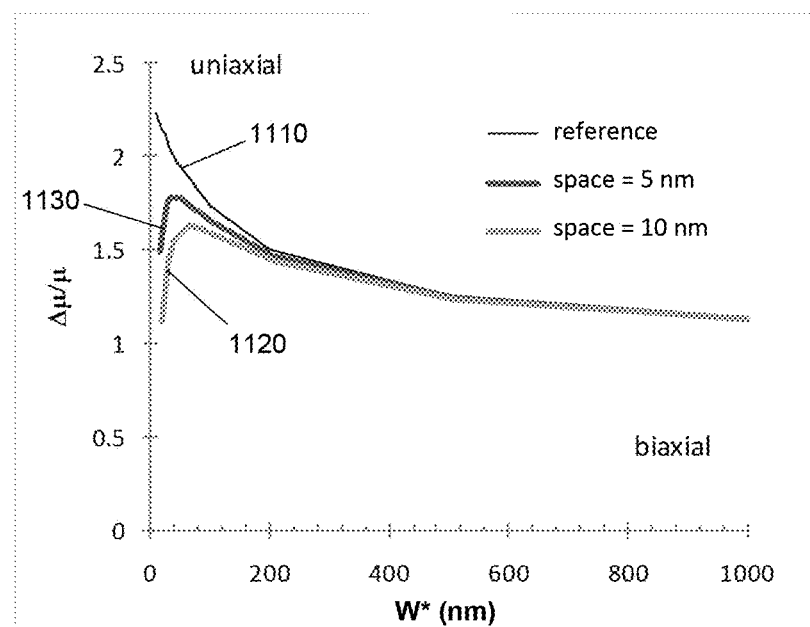
FIGS. 11A-11B illustrate enhancement of carrier mobility for two spacings between strained nanoscale bars as a function of bar width, in some embodiments.

FIG. 11A graphically represents enhancement in carrier mobility of a semiconductor bar that is cut or etched from a biaxially-strained semiconductor layer of SiGe having a thickness of 6 nm. Results from two simulations are shown. In the first implementation, represented by the lower curve 1120, the spacing between the sliced nanoscale semiconductor bars is 10 nm. In the second implementation, represented by the curve 1130, the spacing between the sliced semiconductor bars is 5 nm. A reference trace 1110 is also plotted to show mobility enhancement in a single bar having the same overall width and having a uniaxial strain of an equivalent value to that found in the cut bars. The reference trace is provided for comparison purposes only, and represents an ideal condition. The results from the two simulations for different spaces between the sliced bars indicate that the mobility increases with decreasing semiconductor bar width to an upper value, and then decreases with further decrease in the width of the bar.

Figure 11B:
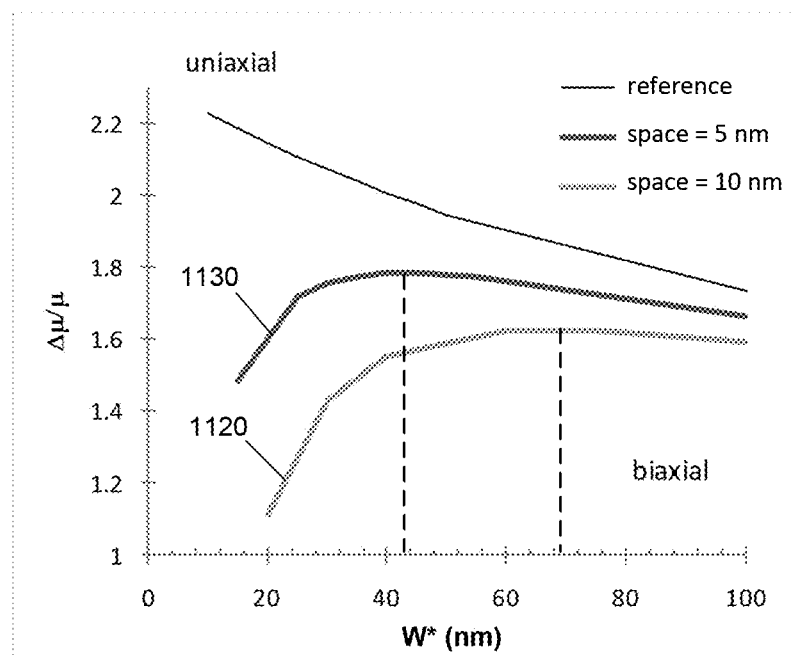

FIG. 11B is an expanded view showing the enhanced mobility ($\Delta\mu/\mu$) in the vicinity of the upper value for each implementation depicted in FIG. 11A. For the implementation in which there is a 10 nm space between each semiconducting bar (trace 1120), an upper value of enhanced mobility is found to occur when the semiconductor bars 390 have a width of approximately 70 nm, indicated by the dashed line to the right. For the implementation in which there is a 5 nm space between the semiconducting bar, an upper value in enhanced mobility is observed for bar widths of about 44 nm. In various embodiments, the width of the semiconductor bars is selected to be approximately equivalent to the upper value of enhanced mobility, for a particular spacing between the semiconductor bars. In some embodiments, the upper value of enhanced mobility is a maximum value of mobility enhancement that can be obtained by slicing the active areas of the FD-SOI transistors.

Although the examples described above are primarily directed to strained SiGe semiconductor, other semiconductor combinations may be used in other embodiments. For example, equivalent process steps may be implemented for biaxially-strained layers of Si, SiC, GaAs, GaN, InP, GaN, InGaAs, InGaN, and other semiconductor materials.

Although the processing steps depicted in FIGS. 5A-5M illustrate some embodiments for forming uniaxially-strained, nanoscale semiconductor bars, in other embodiments, there may be additional, alternative, or fewer steps.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Although the drawings depict one or a few transistor structures, it will be appreciated that a large number of transistors can be fabricated in parallel following the described semiconductor manufacturing processes. A FD-SOI device fabricated according to the present teachings may be formed in an integrated circuit in large numbers and at high densities. The circuits may be used for various low-power applications, including but not limited to, circuits for operating smart phones, computers, tablets, PDA's and other consumer electronics. The transistors may be incorporated as part of microprocessing or memory circuitry for digital or analog signal processing devices. The transistors may be incorporated in logic circuitry, in some implementations. The transistors may be used in additional consumer electronic devices such as televisions, sensors, microcontrollers, field-programmable gate arrays, application specific integrated circuits, analog chips, and digital signal processing chips.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:
1. A transistor comprising:
an insulating layer formed on a substrate;
a plurality of nanoscale, uniaxially-strained semiconductor bars arranged in a horizontal array on the insulating layer, the bars spaced apart from one another by a spacing that is less than 30 nm; and
a single and contiguous gate extending over the horizontal array.
2. The transistor of claim 1, wherein a width of the semiconductor bars is greater than the spacing between the bars.
3. The transistor of claim 1, wherein the spacing between the bars is less than 10 nm.
4. The transistor of claim 1, wherein the nanoscale strained semiconductor bars have uniaxial strain ratios greater than 10:1.
5. The transistor of claim 1, wherein the nanoscale, strained semiconductor bars have uniaxial strain ratios greater than 50:1.
6. The transistor of claim 1, further comprising a plurality of channel regions under the gate formed from a first portion of the horizontal array.
7. The transistor of claim 6, wherein the channel regions are fully depleted.
8. The transistor of claim 7, wherein the insulating layer is an ultra-thin buried oxide having a thickness less than 25 nm.
9. The transistor of claim 6, wherein the transistor is a FD-SOI transistor having an ultra-thin body and buried oxide layer.
10. The transistor of claim 1, wherein a width of each bar of the plurality of nanoscale, strained semiconductor bars is between approximately 10 nm and approximately 200 nm and a height of each bar is less than approximately 20 nm.
11. The transistor of claim 1, wherein the semiconductor bars are formed from one or more of silicon, SiGe or SiC, GaAs, GaN, InP, InAGaAs, InGaN, or combinations thereof.
12. The transistor of claim 1, further comprising source merging material formed at a source region, wherein the source region comprises first portions of the plurality of nanoscale, strained semiconductor bars and the source merging material electrically connects the first portions.
13. The transistor of claim 12, wherein the source merging material comprises an epitaxially-grown semiconductor material grown from the first portions of the horizontal array.
14. The transistor of claim 12, further comprising drain merging material formed at a drain region, wherein the drain region comprises second portions of the plurality of nanoscale, strained semiconductor bars and the drain merging material electrically connects the second portions.
15. The transistor of claim 1 formed in a memory circuit.
16. The transistor of claim 1 formed in a microprocessor circuit.
17. A transistor array, comprising:
a substrate having a buried oxide layer;
a plurality of nanoscale uniaxially-strained semiconductor bars arranged in a horizontal array on the buried oxide layer, the bars spaced apart from one another by a spacing distance that is less than 30 nm;
source regions formed from first portions of the semiconductor bars, the source regions coupled to one another by a source merging material;
drain regions formed from second portions of the semiconductor bars, the drain regions coupled to one another by a drain merging material; and
a single and contiguous gate extending over the horizontal array.
18. The transistor array of claim 17 wherein the source merging material and the drain merging material are epitaxially grown.
19. The transistor array of claim 17 wherein the source regions and the drain regions are doped with ions.
20. The transistor array of claim 17 wherein portions of the semiconductor bars underneath the gate are doped channel regions having a polarity opposite that of the source and drain regions.

* * * * *